(12) United States Patent
Munding (10) Patent No.: US 10,325,783 B2
(45) Date of Patent: Jun. 18, 2019

(54) SEMICONDUCTOR DEVICE INCLUDING STRUCTURE TO CONTROL UNDERFILL MATERIAL FLOW

(71) Applicant: Infineon Technologies AG, Neubiberg (DE)

(72) Inventor: Andreas Munding, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/734,544

(22) Filed: Jun. 9, 2015

(65) Prior Publication Data
US 2016/0365258 A1 Dec. 15, 2016

(51) Int. Cl.
| | |
|---|---|
| *H01L 21/56* | (2006.01) |
| *H01L 23/00* | (2006.01) |
| *H01L 23/31* | (2006.01) |
| *H01L 25/00* | (2006.01) |
| *H01L 25/065* | (2006.01) |

(52) U.S. Cl.
CPC ........ *H01L 21/563* (2013.01); *H01L 23/3142* (2013.01); *H01L 24/17* (2013.01); *H01L 24/73* (2013.01); *H01L 24/81* (2013.01); *H01L 24/83* (2013.01); *H01L 25/0657* (2013.01); *H01L 25/50* (2013.01); *H01L 23/3121* (2013.01); *H01L 24/16* (2013.01); *H01L 24/32* (2013.01); *H01L 24/33* (2013.01); *H01L 24/48* (2013.01); *H01L 2224/16145* (2013.01); *H01L 2224/16225* (2013.01); *H01L 2224/16227* (2013.01); *H01L 2224/26175* (2013.01); *H01L 2224/2919* (2013.01); *H01L 2224/32145* (2013.01); *H01L 2224/32225* (2013.01); *H01L 2224/33181* (2013.01); *H01L 2224/48225* (2013.01); *H01L 2224/73204* (2013.01); *H01L 2224/73215* (2013.01); *H01L 2224/73265* (2013.01); *H01L 2224/81191* (2013.01); *H01L 2224/81193* (2013.01); *H01L 2224/81801* (2013.01); *H01L 2224/83007* (2013.01);
(Continued)

(58) Field of Classification Search
CPC ... H01L 21/563; H01L 23/3142; H01L 24/17; H01L 24/81; H01L 25/0657; H01L 25/50
See application file for complete search history.

(56) References Cited

U.S. PATENT DOCUMENTS

| | | | |
|---|---|---|---|
| 6,734,567 B2 * | 5/2004 | Chiu | ............ H01L 21/563 257/688 |
| 7,550,314 B2 | 6/2009 | Odegard et al. | |

(Continued)

FOREIGN PATENT DOCUMENTS

CN   103681536   3/2014

*Primary Examiner* — Dale E Page
*Assistant Examiner* — Quovaunda Jefferson
(74) *Attorney, Agent, or Firm* — Dicke, Billig & Czaja, PLLC (57) ABSTRACT

A semiconductor device includes a substrate, a semiconductor chip, and an array of contact elements electrically coupling the substrate to the semiconductor chip. The semiconductor device includes an underfill material between the substrate and the semiconductor chip and between the contact elements. A patterned structure is arranged on the substrate and extends from under the semiconductor chip through a keep-out zone around an edge of the semiconductor chip. The patterned structure provides a reservoir for the underfill material.

18 Claims, 8 Drawing Sheets

(52) U.S. Cl.
CPC ............ *H01L 2224/83102* (2013.01); *H01L 2224/92125* (2013.01); *H01L 2225/06513* (2013.01)

(56) References Cited

U.S. PATENT DOCUMENTS

| | | | | |
|---|---|---|---|---|
| 7,750,457 B2 * | 7/2010 | Seko | ..................... | H01L 21/563 257/668 |
| 7,759,802 B2 * | 7/2010 | Miyazaki | ............... | H01L 21/563 257/778 |
| 8,399,300 B2 | 3/2013 | Lee et al. | | |
| 8,441,123 B1 | 5/2013 | Lee et al. | | |
| 8,982,577 B1 * | 3/2015 | Fuentes | ................. | H01L 21/563 257/787 |
| 8,987,903 B2 | 3/2015 | Tanaka et al. | | |
| 2004/0036179 A1 | 2/2004 | Chiu et al. | | |
| 2007/0269930 A1 * | 11/2007 | Gupta | ................... | H01L 21/563 438/108 |
| 2010/0116534 A1 * | 5/2010 | Choi | ..................... | H01L 21/563 174/260 |
| 2010/0155965 A1 * | 6/2010 | Igarashi | ................ | H01L 21/563 257/778 |
| 2012/0295405 A1 * | 11/2012 | Babiarz | ................. | H01L 21/563 438/127 |
| 2014/0048934 A1 | 2/2014 | Chen et al. | | |
| 2014/0151873 A1 * | 6/2014 | Tanaka | ..................... | H01L 24/83 257/737 |

* cited by examiner

SEMICONDUCTOR DEVICE INCLUDING STRUCTURE TO CONTROL UNDERFILL MATERIAL FLOW

BACKGROUND

A semiconductor device may include a semiconductor chip having a plurality of contact elements electrically coupled to a substrate in a flip chip configuration. The semiconductor chip may be underfilled with an electrically insulating underfill material. The underfill material should be void free to distribute any thermal expansion mismatch between the semiconductor chip and the substrate. A void free underfill material, however, is difficult to achieve because various propagation paths with different wetting dynamics and different capillary forces may exist in parallel. Air may be trapped when the propagation speed of the underfill material in these paths is strongly inhomogeneous. For example, the propagation of underfill material through contact elements may take longer than the wetting of the semiconductor chip sidewalls and the formation of a meniscus around the edges of the semiconductor chip. In this case, the sides of the semiconductor chip may be sealed off and an air bubble may be trapped before the underfill material has flowed through the contact elements. In addition, wire bond pads or other functional structures outside the perimeter of the semiconductor chip may be wetted by the underfill material, thus contaminating the wire bond pads or other functional structures.

For these and other reasons, there is a need for the present invention.

SUMMARY

One example of a semiconductor device includes a substrate, a semiconductor chip, and an array of contact elements electrically coupling the substrate to the semiconductor chip. The semiconductor device includes an underfill material between the substrate and the semiconductor chip and between the contact elements. A patterned structure is arranged on the substrate and extends from under the semiconductor chip through a keep-out zone around an edge of the semiconductor chip. The patterned structure provides a reservoir for the underfill material.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1:
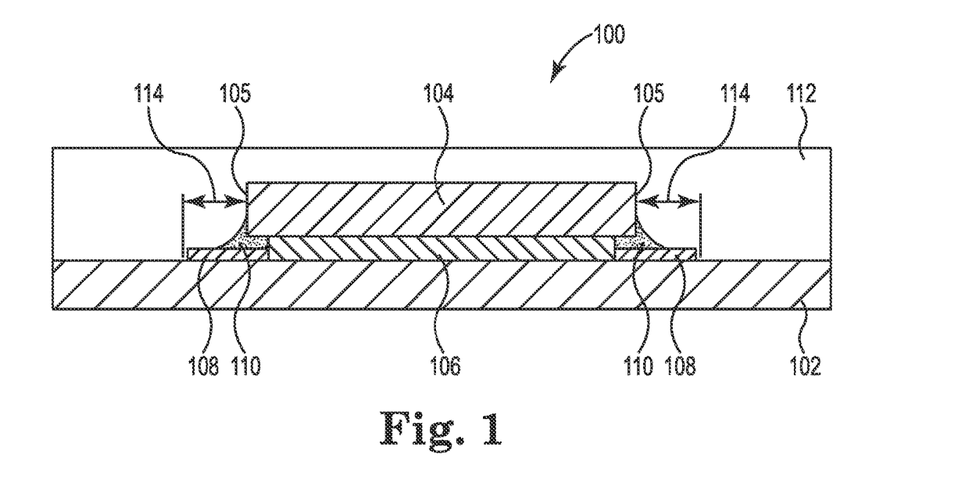
FIG. 1 illustrates a cross-sectional view of one example of a semiconductor device.

FIG. 1 illustrates a cross-sectional view of one example of a semiconductor device 100. Semiconductor device 100 includes a substrate 102, a semiconductor chip 104, an array of contact elements 106, a patterned structure 108, an underfill material 110, and an encapsulation material 112. Substrate 102 may be any suitable substrate, such as a semiconductor substrate, a printed circuit board, or another semiconductor chip. Semiconductor chip 104 is electrically coupled to substrate 102 via array of contact elements 106. Patterned structure 108 is arranged on substrate 102 adjacent to array of contact elements 106. Patterned structure 108 extends from under semiconductor chip 104 through a keep-out zone 114 around an edge 105 of semiconductor chip 104. Underfill material 110, such as an epoxy or another suitable insulating material, is between substrate 102 and semiconductor chip 104 and between the contact elements of array of contact elements 106. Underfill material 110 is also on and within patterned structure 108 and forms a meniscus on the edges 105 of semiconductor chip 104. Encapsulation material 112 (e.g., a mold material) encapsulates semiconductor chip 104, underfill material 110, patterned structure 108, and a portion (e.g., top surface) of substrate 102.

Patterned structure 108 provides a reservoir for underfill material 110 and prevents underfill material 110 from wetting substrate 102 outside of keep-out zone 114. As used herein, a keep-out zone is an area around a semiconductor chip in which underfill material may be present and outside of which underfill material should not be present. Patterned structure 108 provides an underfill material propagation path away from edges 105 of semiconductor chip 104 when underfilling semiconductor chip 104. The patterned structure slows down the propagation of the underfill material along the edges 105 of semiconductor chip 104 such that the underfill material propagates through array of contact elements 106 faster than along edges 105 of semiconductor chip 104. Thus, patterned structure 108 prevents the trapping of air bubbles under semiconductor chip 104 during the underfilling of semiconductor chip 104.

Figure 2:
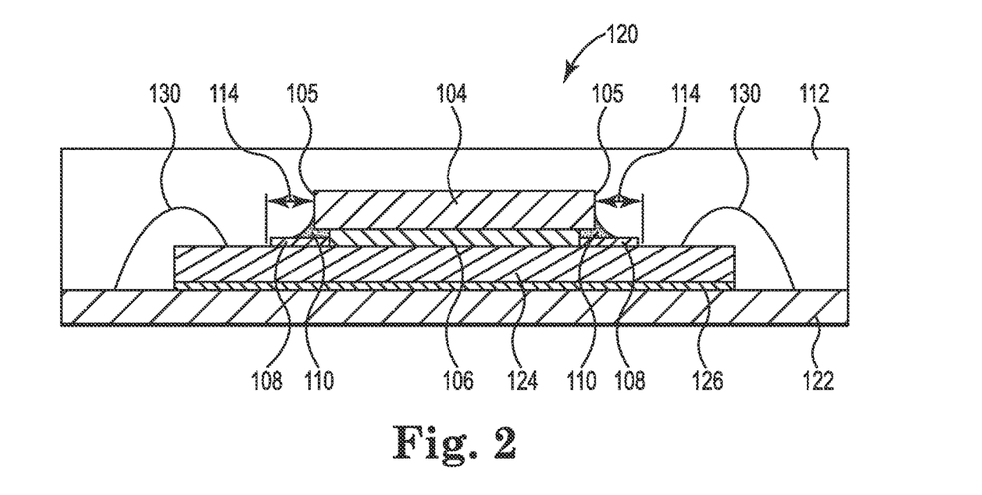
FIG. 2 illustrates a cross-sectional view of another example of a semiconductor device.

FIG. 2 illustrates a cross-sectional view of another example of a semiconductor device 120. Semiconductor device 120 includes a substrate 122, a first semiconductor chip 124, a second semiconductor chip 104, an array of contact elements 106, a patterned structure 108, an underfill material 110, bond wires 130, and an encapsulation material 112. Substrate 122 may be any suitable substrate, such as a semiconductor substrate, a lead frame, or a printed circuit board. First semiconductor chip 124 is coupled to substrate 122 via a joint 126. Joint 126 may be a diffusion solder joint, a sintered joint, a soft solder joint, an adhesive material, or another suitable material for coupling first semiconductor chip 124 to substrate 122. In one example, joint 126 electrically couples first semiconductor chip 124 to substrate 122. In another example, joint 126 thermally couples first semiconductor chip 124 to substrate 122. Contacts of first semiconductor chip 124 are electrically coupled to contacts of substrate 122 via bond wires 130.

Second semiconductor chip 104 is electrically coupled to first semiconductor chip 124 via array of contact elements 106. Patterned structure 108 is formed on first semiconductor chip 124 adjacent to array of contact elements 106. Patterned structure 108 extends from under second semiconductor chip 104 through a keep-out zone 114 around an edge 105 of second semiconductor chip 104. Underfill material 110 is between first semiconductor chip 124 and second semiconductor chip 104 and between the contact elements of array of contact elements 106. Underfill material 110 is also on and within patterned structure 108 and forms a meniscus on the edges 105 of second semiconductor chip 104. Encapsulation material 112 encapsulates second semiconductor chip 104, first semiconductor chip 124, underfill material 110, patterned structure 108, and a portion (e.g., top surface) of substrate 122. When underfilling second semiconductor chip 104, patterned structure 108 slows down the propagation of the underfill material along the edges 105 of second semiconductor chip 104 such that the underfill material propagates through array of contact elements 106 faster than along edges 105 of second semiconductor chip 104.

Figure 3A:
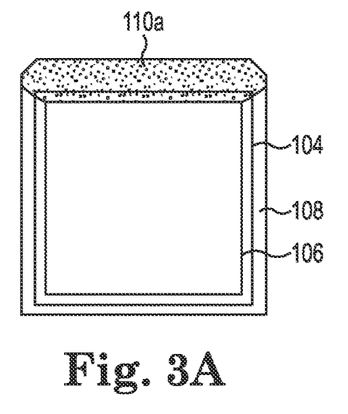
FIGS. 3A-3F illustrate one example of the flow of underfill material for the semiconductor device of FIG. 1.
Figure 3B:
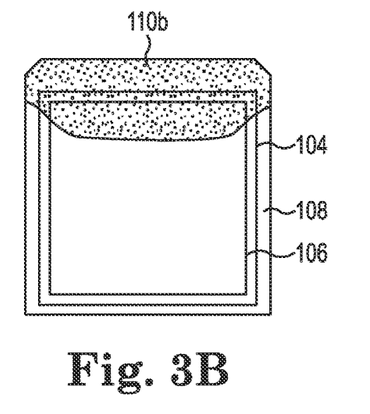

FIGS. 3A-3F illustrate one example of the flow of underfill material for semiconductor device 100 or 120 previously described and illustrated with reference to FIG. 1 or 2, respectively. As illustrated in FIG. 3A, underfill material as indicated at 110a is dispensed in a 1-stroke pattern along one edge of semiconductor chip 104. As illustrated in FIG. 3B, due to capillary forces, the underfill material as indicated at 110b flows through array of contact elements 106 and patterned structure 108. Due to patterned structure 108, however, the underfill material flows through array of contact element 106 faster than around the edges of semiconductor chip 104.

Figure 3C:
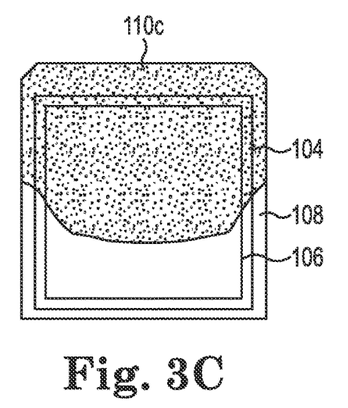
Figure 3D:
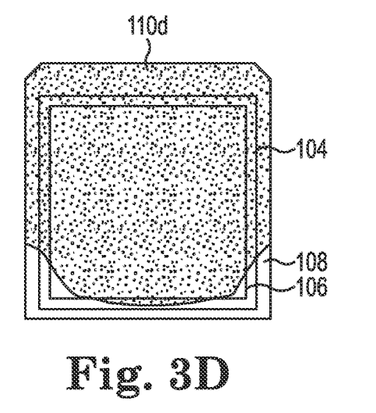
Figure 3E:
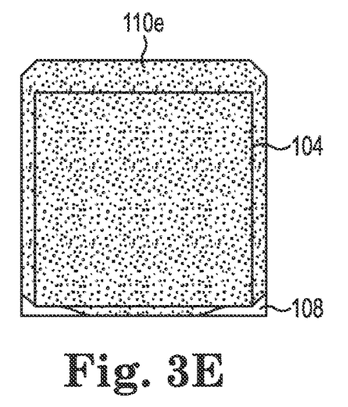
Figure 3F:
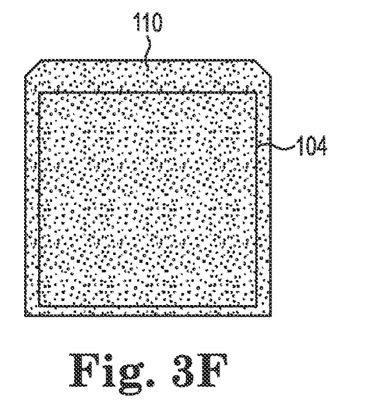

The underfill material continues to flow through array of contact elements 106 and patterned structure 108 as indicated by underfill material 110c as illustrated in FIG. 3C and as indicated by underfill material 110d as illustrated in FIG. 3D. As illustrated in FIG. 3E, the underfill material as indicated at 110e completely flows through array of contact elements 106 prior to completely flowing around the edges of semiconductor chip 104, thus preventing the trapping of air bubbles under semiconductor chip 104. FIG. 3F illustrates underfill material 110 once the underfilling process is complete. Underfill material 110 underfills semiconductor chip 104 without air bubbles and is contained within patterned structure 106.

Figure 4A:
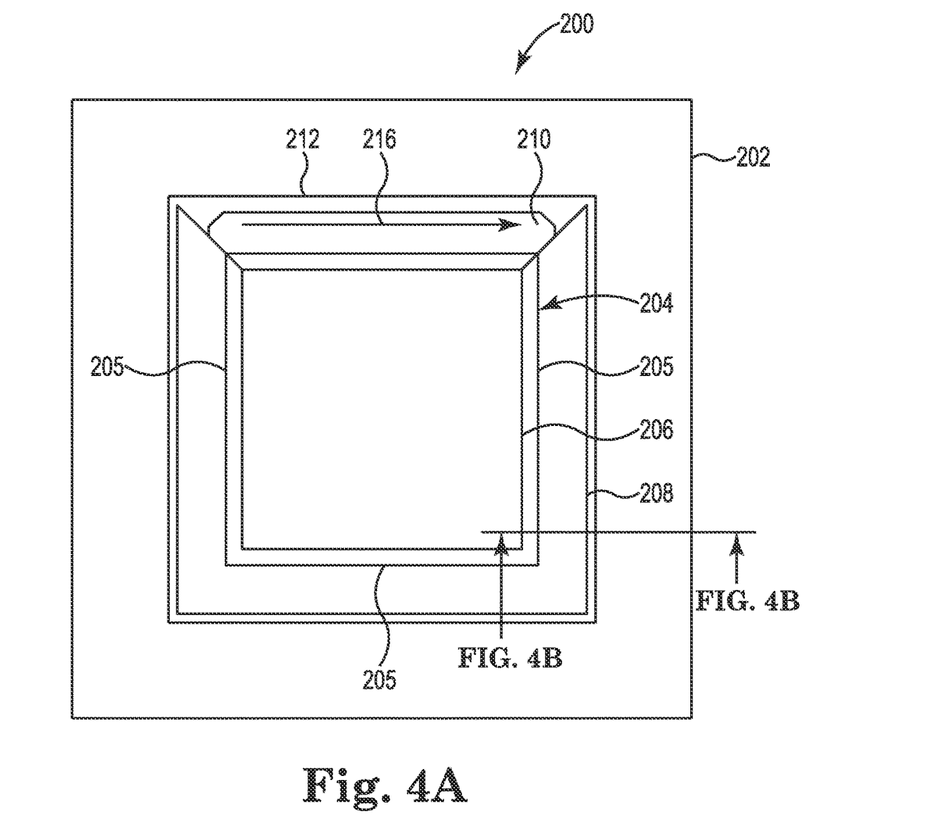
FIGS. 4A and 4B illustrate one example of a semiconductor device including a patterned structure for controlling the flow of underfill material.
Figure 4B:
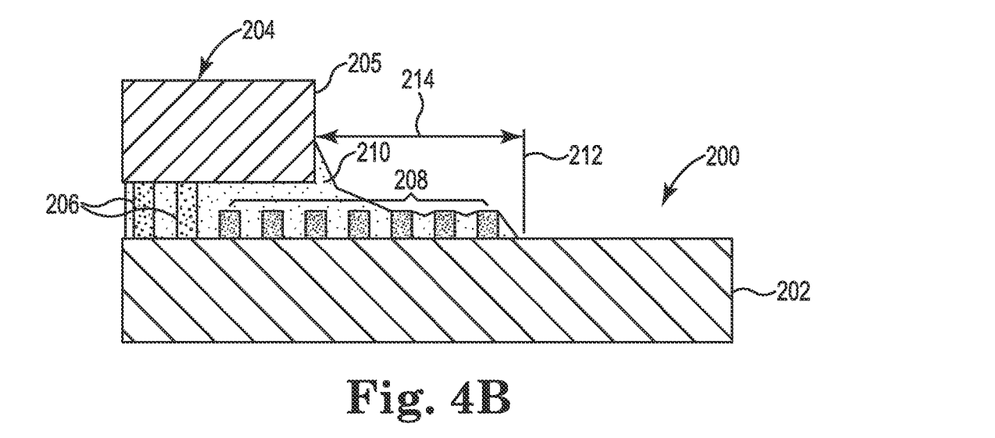

FIG. 4A illustrates a top view of one example of a semiconductor device 200 including a patterned structure for controlling the flow of underfill material. FIG. 4B illustrates a cross-sectional view of a portion of semiconductor device 200 as indicated in FIG. 4A. Semiconductor device 200 includes a substrate 202, a semiconductor chip 204, an array of contact elements 206, a patterned structure 208, and an underfill material 210. Substrate 202 may be any suitable substrate, such as a semiconductor substrate, another semiconductor chip, or a printed circuit board. Semiconductor chip 204 is electrically coupled to substrate 202 via array of contact elements 206. In one example, array of contacts element 206 is a micro pillar array in which each of a plurality of contact elements (e.g., one half of each pillar) of substrate 202 is soldered to a corresponding contact element (e.g., the other half of each pillar) of semiconductor chip 204. Patterned structure 208 is arranged on substrate 202 and extends from under semiconductor chip 204 through a keep-out zone 214 defined as between an edge 205 of semiconductor chip 204 and a boundary indicated at 212. Underfill material 210 is between substrate 202 and semiconductor chip 204 and between the contact elements of array of contact elements 206. Underfill material 210 is also on and within patterned structure 208 and forms a meniscus on the edges 205 of semiconductor chip 204.

Patterned structure 208 extends around three sides of semiconductor chip 204. A 1-stroke underfill dispensing zone as indicated at 216 extends along the remaining side of semiconductor chip 204. Patterned structure 208 provides a reservoir for underfill material 210 and prevents underfill material 210 from wetting substrate 202 outside of keep-out zone 214. The patterned structure provides an underfill material propagation path away from edges 205 of semiconductor chip 204 when underfilling semiconductor chip 204 using the 1-stroke dispense pattern indicated at 216. Patterned structure 208 slows down the propagation of the underfill material along edges 205 of semiconductor chip 204 such that the underfill material propagates through array of contact elements 206 faster than along edges 205 of semiconductor chip 204. Thus, patterned structure 208 prevents the trapping of air bubbles under semiconductor chip 204 during the underfilling of semiconductor chip 204.

In this example, patterned structure 208 includes a plurality of contact elements arranged on substrate 202 that do not contact semiconductor chip 204. In one example, the pattern of contact elements 208 continues the pattern of contact elements 206 on three sides of semiconductor chip 204. In this example, for contact elements formed by plating, the through mask plating uniformity is improved for the array of contact elements 206 since edge distortions of the electrical field during plating are moved to an area where they are less relevant. In another example, the pattern of contact elements 208 is different from the pattern of array of contact elements 206. For example, if the unit cell of array of contact elements 206 is rectangular, the unit cell of contact elements 208 may be hexagonal with a different pitch (i.e., different pattern density).

Figure 5:
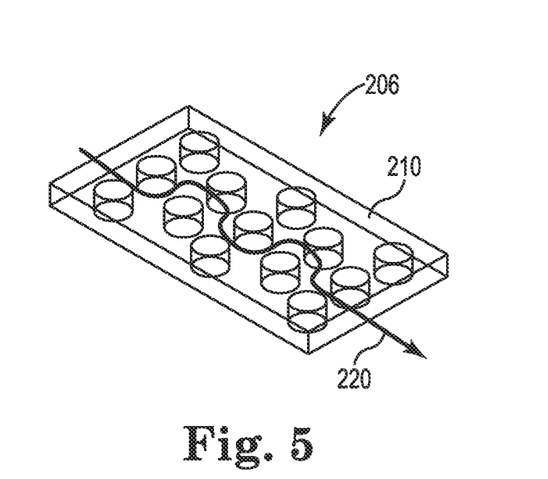
FIG. 5 illustrates one example of a portion of an array of contact elements of the semiconductor device of FIGS. 4A and 4B.

FIG. 5 illustrates one example of a portion of array of contact elements 206 of semiconductor device 200 previously described and illustrated with reference to FIGS. 4A and 4B. In this example, array of contact elements 206 includes contact elements arranged in a hexagonal pattern. The array of contact elements 206 may have a pitch down to 40 μm or less. During underfilling of semiconductor chip 204, the underfill material flows from the side of semiconductor chip 204 where the underfill material is dispensed through the contact elements 206 due to capillary forces as indicated by underfill material flow path 220.

Figure 6:
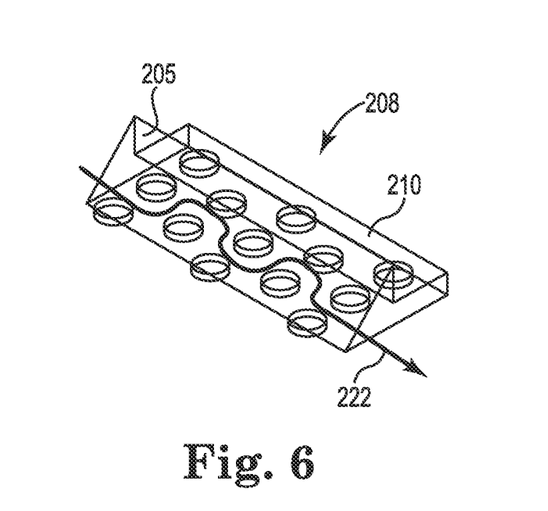
FIG. 6 illustrates one example of a portion of a patterned structure of the semiconductor device of FIGS. 4A and 4B.

FIG. 6 illustrates one example of a portion of patterned structure 208 of semiconductor device 200 previously described and illustrated with reference to FIGS. 4A and 4B. In this example, the contact elements of patterned structure 208 continue the hexagonal pattern of array of contact elements 206 illustrated in FIG. 5. During underfilling of semiconductor chip 204, the underfill material flows from the side of semiconductor chip 204 where the underfill material is dispensed through the contact elements of patterned structure 208 due to capillary forces as indicated by underfill material flow path 222. The contact elements of patterned structure 208 slow down the propagation of the underfill material along edges 205 of the semiconductor chip and the formation of the meniscus on edges 205 of the semiconductor chip.

Figure 7A:
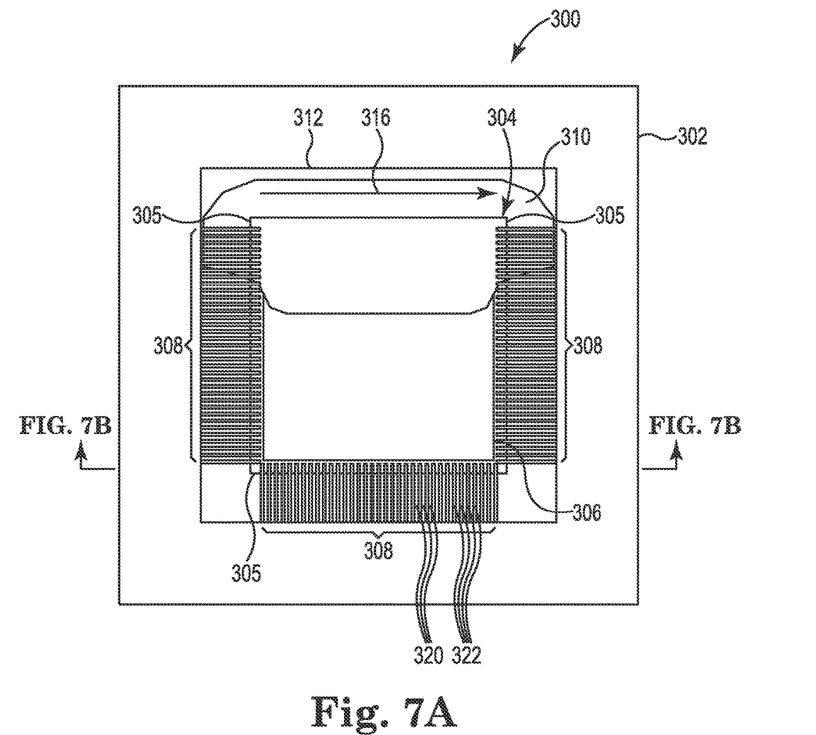
FIGS. 7A and 7B illustrate another example of a semiconductor device including a patterned structure for controlling the flow of underfill material.
Figure 7B:
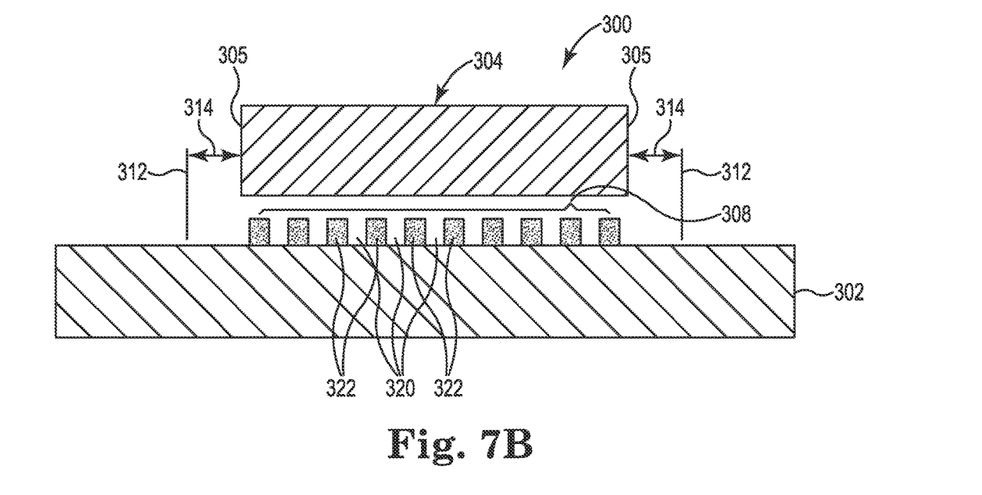

FIG. 7A illustrates a top view of another example of a semiconductor device 300 including a patterned structure for controlling the flow of underfill material. FIG. 7B illustrates a cross-sectional view of semiconductor device 300 as indicated in FIG. 7A. Semiconductor device 300 includes a substrate 302, a semiconductor chip 304, an array of contact elements 306, a patterned structure 308, and an underfill material 310. Substrate 302 may be any suitable substrate, such as a semiconductor substrate, another semiconductor chip, or a printed circuit board. Semiconductor chip 304 is electrically coupled to substrate 302 via array of contact elements 306. In one example, array of contacts element 306 is a micro pillar array in which each of a plurality of contact elements (e.g., one half of each pillar) of substrate 302 is soldered to a corresponding contact element (e.g., the other half of each pillar) of semiconductor chip 304. Patterned structure 308 is arranged on substrate 302 adjacent to array of contact elements 306. Patterned structure 308 extends from under semiconductor chip 304 through a keep-out zone 314 defined as between an edge 305 of semiconductor chip 304 and a boundary indicated at 312. During underfilling of semiconductor chip 304, underfill material 310 flows between substrate 302 and semiconductor chip 304 and between the contact elements of array of contact elements 306. Underfill material 310 also flows on and within patterned structure 308.

Patterned structure 308 extends around three sides of semiconductor chip 304. A 1-stroke underfill dispensing zone as indicated at 316 extends along the remaining side of semiconductor chip 304. Patterned structure 308 provides a reservoir for underfill material 310 and prevents underfill material 310 from wetting substrate 302 outside of keep-out zone 314. The patterned structure provides an underfill material propagation path away from edges 305 of semiconductor chip 304 when underfilling semiconductor chip 304 using the 1-stroke dispense pattern indicated at 316. As illustrated in FIG. 7A, patterned structure 308 slows down the propagation of the underfill material along edges 305 of semiconductor chip 304 such that the underfill material propagates through array of contact elements 306 faster than along edges 305 of semiconductor chip 304. Thus, patterned structure 308 prevents the trapping of air bubbles under semiconductor chip 304 during the underfilling of semiconductor chip 304.

In this example, patterned structure 308 includes a plurality of parallel channels 320 defined by spaced apart parallel line structures 322 on three sides of semiconductor chip 304. Each channel 320 extends orthogonally from a side of semiconductor chip 304 and from under semiconductor chip 304 to a respective side (i.e., boundary 312) of keep-out zone 314. Line structures 322 are orthogonal to the flow of underfill material on the two opposite sides of semiconductor chip 304 perpendicular to the side of semiconductor chip 304 where the underfill material is dispensed. Line structures 322 are parallel to the flow of underfill material on the side of semiconductor chip 304 opposite to the side of semiconductor chip 304 where the underfill material is dispensed. Line structures 322 may be made of the same material (e.g., via plating) as array of contact elements 306, a polymer material (e.g., via photo lithography, printing, or dispensing), or another suitable electrically conductive or electrically insulating material.

Figure 8A:
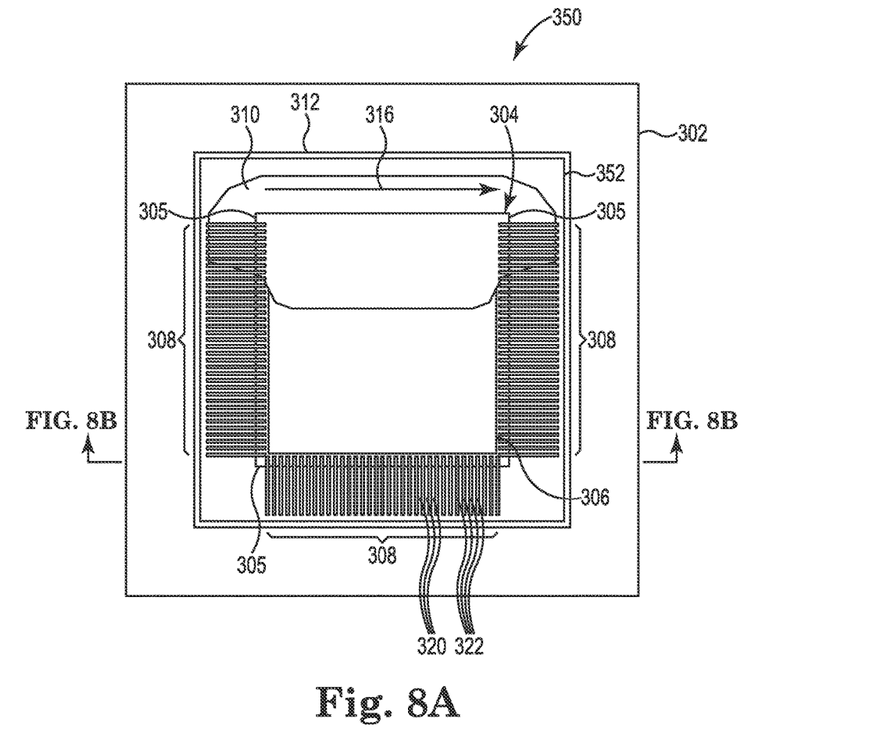
FIGS. 8A and 8B illustrate another example of a semiconductor device including a patterned structure and a dam for controlling the flow of underfill material.
Figure 8B:
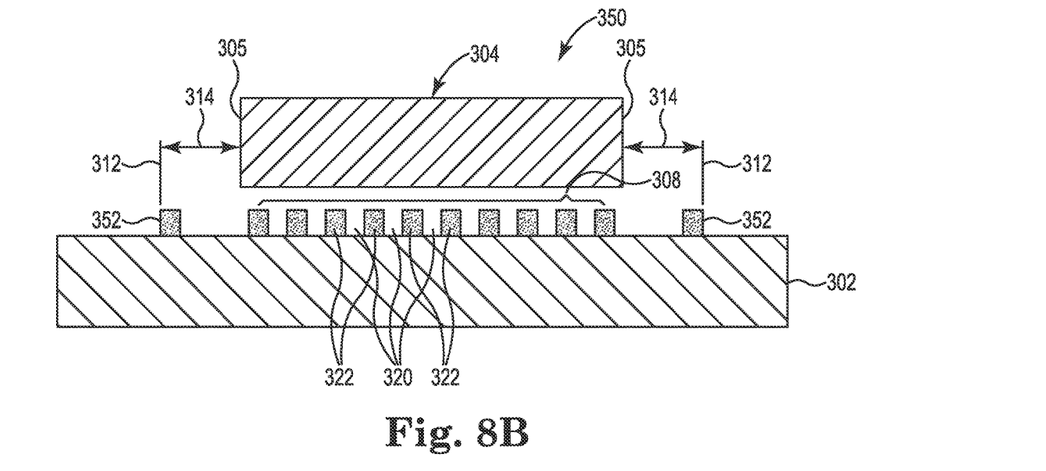

FIG. 8A illustrates a top view of another example of a semiconductor device 350 including a patterned structure and a dam for controlling the flow of underfill material. FIG. 8B illustrates a cross-sectional view of semiconductor device 350 as indicated in FIG. 8A. Semiconductor device 350 is similar to semiconductor device 300 previously described and illustrated with reference to FIGS. 7A and 7B except that semiconductor device 350 includes a dam 352. Dam 352 extends around semiconductor chip 304 at the border 312 of keep-out zone 314 and is spaced apart from patterned structure 308. Dam 352 prevents any underfill material from flowing out of keep-out zone 314.

Figure 9:
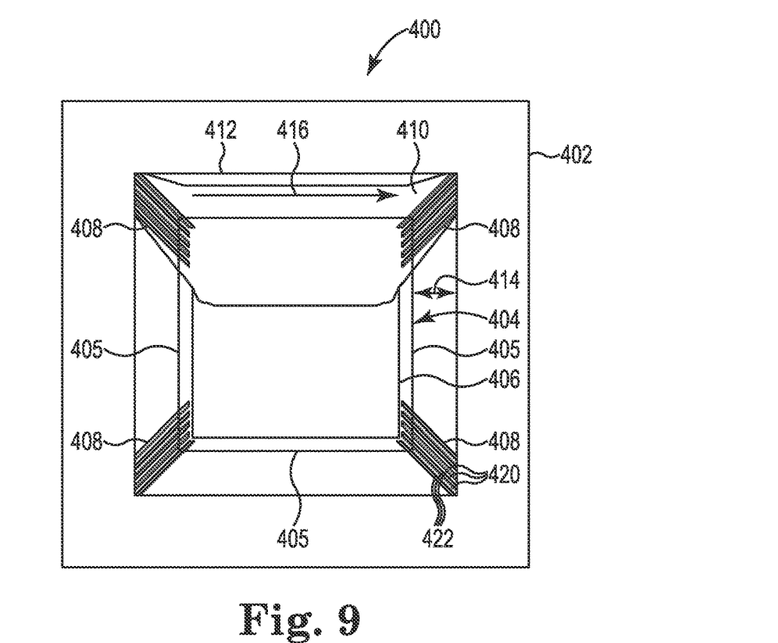
FIG. 9 illustrates another example of a semiconductor device including a patterned structure for controlling the flow of underfill material.

FIG. 9 illustrates a top view of another example of a semiconductor device 400 including a patterned structure for controlling the flow of underfill material. Semiconductor device 400 includes a substrate 402, a semiconductor chip 404, an array of contact elements 406, a patterned structure 408, and an underfill material 410. Substrate 402 may be any suitable substrate, such as a semiconductor substrate, another semiconductor chip, or a printed circuit board. Semiconductor chip 404 is electrically coupled to substrate 402 via array of contact elements 406. In one example, array of contacts element 406 is a micro pillar array in which each of a plurality of contact elements (e.g., one half of each pillar) of substrate 402 is soldered to a corresponding contact element (e.g., the other half of each pillar) of semiconductor chip 404. Patterned structure 408 is arranged on substrate 402 adjacent to array of contact elements 406. Patterned structure 408 extends from under semiconductor chip 404 at the corners of semiconductor chip 404 through a keep-out zone 414 defined as between an edge 405 of semiconductor chip 404 and a boundary indicated at 412. During underfilling of semiconductor chip 404, underfill material 410 flows between substrate 402 and semiconductor chip 404 and between the contact elements of array of contact elements 406. Underfill material 410 also flows on and within patterned structure 408.

Patterned structure 408 extends from each corner of semiconductor chip 404. A 1-stroke underfill dispensing zone as indicated at 416 extends along one side of semiconductor chip 404. Patterned structure 408 provides a reservoir for underfill material 410 and prevents underfill material 410 from wetting substrate 402 outside of keep-out zone 414. The patterned structure provides an underfill material propagation path away from edges 405 of semiconductor chip 404 when underfilling semiconductor chip 404 using the 1-stroke dispense pattern indicated at 416. Patterned structure 408 slows down the propagation of the underfill material along edges 405 of semiconductor chip 404 such that the underfill material propagates through array of contact elements 406 faster than along edges 405 of semiconductor chip 404. Thus, patterned structure 408 prevents the trapping of air bubbles under semiconductor chip 404 during the underfilling of semiconductor chip 404.

Patterned structure 408 includes a plurality of parallel channels 420 defined by spaced apart parallel line structures 422 at each corner of semiconductor chip 404. Each channel 420 extends from under semiconductor chip 404 through keep-out zone 414. The corners of a rectangular keep-out zone are usually dead zones, since underfill material that spreads along the diagonal is distributed along two directions and does not reach the corner. By filling the reservoir provided by patterned structure 408 with underfill material, keep-out zone 414 is better utilized and may thus be smaller with patterned structure 408 than without patterned structure 408. Line structures 422 may be made of the same material (e.g., via plating) as array of contact elements 406, a polymer material (e.g., via photo lithography, printing, or dispensing), or another suitable electrically conductive or electrically insulating material.

Figure 10:
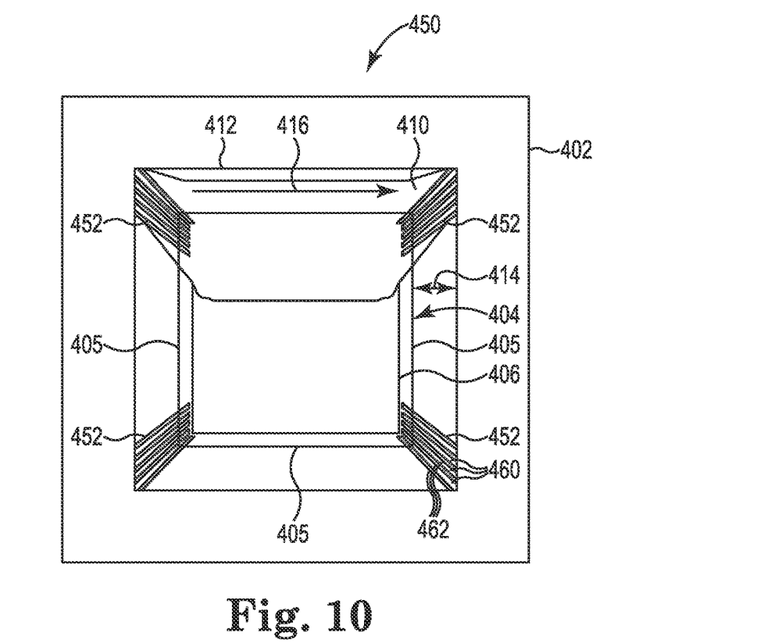
FIG. 10 illustrates another example of a semiconductor device including a patterned structure for controlling the flow of underfill material.

FIG. 10 illustrates a top view of another example of a semiconductor device 450 including a patterned structure for controlling the flow of underfill material. Semiconductor device 450 is similar to semiconductor device 400 previously described and illustrated with reference to FIG. 9 except that in semiconductor device 450 patterned structure 452 is used in place of patterned structure 408. Patterned structure 452 includes a plurality of channels 460 defined by spaced apart line structures 462 at each corner of semiconductor chip 404. Each channel 460 extends from under semiconductor chip 404 through keep-out zone 414. In this example, structured lines 462 of patterned structure 452 diverge from each other to define divergent channels 460. In other examples, patterned structure 452 may include a combination of parallel and divergent structured lines 462 to define a combination of parallel and divergent channels 460.

Figure 11:
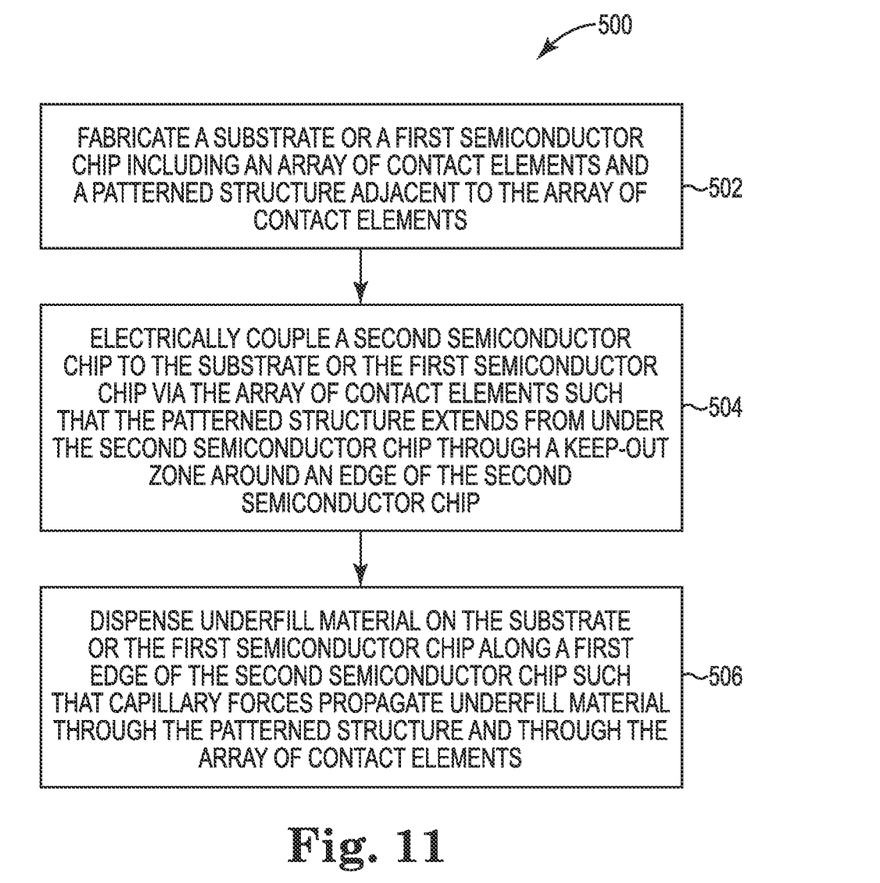
FIG. 11 is a flow diagram illustrating one example of a method for fabricating a semiconductor device.

FIG. 11 is a flow diagram illustrating one example of a method 500 for fabricating a semiconductor device, such as semiconductor device 100 or 120 previously described and illustrated with reference to FIGS. 1 and 2, respectively. At 502, a substrate or a first semiconductor chip including an array of contact elements and a patterned structure adjacent to the array of contact elements is fabricated. At 504, a second semiconductor chip is electrically coupled to the substrate or the first semiconductor chip via the array of contact elements such that the patterned structure extends from under the second semiconductor chip through a keep-out zone around an edge of the second semiconductor chip. At 506, underfill material is dispensed on the substrate or the first semiconductor chip along a first edge of the second semiconductor chip such that capillary forces propagate underfill material through the patterned structure and through the array of contact elements.

In one example, the patterned structure slows down the propagation of the underfill material along second and third edges of the second semiconductor chip such that the underfill material propagates through the array of contact elements faster than along the second and third edges, where the second and third edges are perpendicular to the first edge. Fabricating the substrate or the first semiconductor chip may include fabricating a patterned structure including a plurality of contact elements. In another example, fabricating the substrate or the first semiconductor chip may include fabricating a patterned structure including a plurality of channels defined by spaced apart line structures, where each channel extends from under the second semiconductor chip through the keep-out zone.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a substrate;
   a semiconductor chip;
   an array of electrical contact elements, a first portion of the array of electrical contact elements electrically coupling the substrate to the semiconductor chip;
   underfill material between the substrate and the semiconductor chip and between the first portion of the array of electrical contact elements; and
   a patterned structure arranged adjacent to the first portion of the array of electrical contact elements on the substrate such that no portion of the patterned structure is between any two contact elements within the first portion of the array of contact elements, the patterned structure extending from under the semiconductor chip away from the first portion of the array of contact elements through a keep-out zone around edges of the semiconductor chip,
   wherein the patterned structure comprises a second portion of the array of electrical contact elements that do not electrically contact the semiconductor chip, wherein each contact element within the second portion of the array of electrical contact elements is spaced apart from adjacent contact elements within the second portion of the array of electrical contact elements and has a height that is less than a height of the first portion of the array of electrical contact elements, the space between the adjacent contact elements within the second portion of the array of electrical contact elements providing a reservoir that is filled with the underfill material to slow the propagation of the underfill material along the edges of the semiconductor chip, wherein the second portion of the array of electrical contact elements continues a pattern of the first portion of the array of electrical contact elements.

2. The semiconductor device of claim 1, wherein the second portion of the array of electrical contact elements that do not electrically contact the semiconductor chip comprise first electrical contact elements under the semiconductor chip and second electrical contact elements in the keep-out zone around the edge of the semiconductor chip.

3. The semiconductor device of claim 2, wherein the second portion of the array of electrical contact elements has a different pattern from the first portion of the array of electrical contact elements.

4. The semiconductor device of claim 1, wherein the array of contact elements comprises a pillar array.

5. The semiconductor device of claim 1,
   wherein the substrate comprises an underfill dispensing zone in which there is no patterned structure.

6. A semiconductor device comprising:
   a substrate;
   a semiconductor chip;
   an array of contact elements extending from a first surface of the substrate and electrically coupling the substrate to the semiconductor chip;
   underfill material between the substrate and the semiconductor chip and between the contact elements; and
   a patterned structure adjacent to and separate from the array of contact elements and arranged on the substrate such that no portion of the patterned structure is between any two contact elements within the array of contact elements, the patterned structure extending from under the semiconductor chip away from the array of contact elements through a keep-out zone around edges of the semiconductor chip,
   wherein the patterned structure comprises a plurality of spaced apart line structures that extend from the first surface of the substrate to define at least three channels, each line structure having a width and a height that is less than a height of the array of contact elements, the at least three channels providing a reservoir that is filled with the underfill material to slow the propagation of the underfill material along the edges of the semiconductor chip.

7. The semiconductor device of claim 6, wherein the spaced apart line structures comprise an electrically insulating material.

8. The semiconductor device of claim 6, wherein the spaced apart line structures comprises an electrically conductive material.

9. The semiconductor device of claim 6, wherein channels extend from each corner of the first semiconductor chip to a respective corner of the keep-out zone.

10. The semiconductor device of claim 9, wherein the channels extending from each corner of the first semiconductor chip are parallel channels.

11. A semiconductor device comprising:
a substrate;
a semiconductor chip;
an array of contact elements electrically coupling the substrate to the semiconductor chip;
underfill material between the substrate and the semiconductor chip and between the contact elements; and
a patterned structure arranged adjacent to the array of contact elements on the substrate such that no portion of the patterned structure is between any two contact elements within the array of contact elements, the patterned structure extending from under the semiconductor chip away from the array of contact elements through a keep-out zone around edges of the semiconductor chip;
wherein the patterned structure comprises a plurality of channels defined by spaced apart line structures, each line structure having a width, a length greater than the width, and a height that is less than a height of the array of contact elements, the channels providing a reservoir that is filled with the underfill material to slow the propagation of the underfill material along the edges of the semiconductor chip, and each channel and line structure extending from under the semiconductor chip orthogonally to a corresponding side of the semiconductor chip through the keep-out zone,
wherein channels extend from each corner of the first semiconductor chip to a respective corner of the keep-out zone, and
wherein the channels extending from each corner of the first semiconductor chip are divergent channels.

12. A semiconductor device comprising:
a substrate;
a semiconductor chip;
an array of contact elements electrically coupling the substrate to the semiconductor chip;
underfill material between the substrate and the semiconductor chip and between the contact elements; and
a patterned structure arranged adjacent to the array of contact elements on the substrate such that no portion of the patterned structure is between any two contact elements within the array of contact elements, the patterned structure extending from under the semiconductor chip away from the array of contact elements through a keep-out zone around edges of the semiconductor chip,
wherein the patterned structure comprises a plurality of channels defined by spaced apart line structures, each line structure having a width, a length greater than the width, and a height that is less than a height of the array of contact elements, the channels providing a reservoir that is filled with the underfill material to slow the propagation of the underfill material along the edges of the semiconductor chip, and each channel and line structure extending from under the semiconductor chip through the keep-out zone, and
wherein the patterned structure comprises:
first channels extending orthogonally from a first side of the semiconductor chip to a first side of the keep-out zone;
second channels extending orthogonally from a second side of the semiconductor chip to a second side of the keep-out zone; and
third channels extending orthogonally from a third side of the semiconductor chip to a third side of the keep-out zone.

13. A semiconductor device comprising:
a first semiconductor chip;
a second semiconductor chip;
a plurality of electrical contact elements, at least a first portion of the plurality of electrical contact elements electrically coupling the first semiconductor chip to the second semiconductor chip;
underfill material between the first semiconductor chip and the second semiconductor chip and between the electrical contact elements; and
a patterned structure arranged on the first semiconductor chip such that no portion of the patterned structure is between any two contact elements within the plurality of electrical contact elements, the patterned structure extending from under the second semiconductor chip away from the plurality of electrical contact elements through a keep-out zone around edges of the second semiconductor chip, the patterned structure providing an underfill material propagation path away from the edge of the second semiconductor chip,
wherein the patterned structure comprises a second portion of the plurality of electrical contact elements that are adjacent to and separate from the first portion of the plurality of contact elements and do not electrically couple the first semiconductor chip to the second semiconductor chip, wherein each contact element within the second portion of the plurality of contact elements is spaced apart from adjacent contact elements within the second portion of the plurality of contact elements and has a height that is less than a height of the first portion of the plurality of electrical contact elements, the space between the adjacent contact elements within the second portion of the plurality of electrical contact elements providing a reservoir that is filled with the underfill material to slow the propagation of the underfill material along the edges of the semiconductor chip, wherein the patterned structure includes a plurality of spaced apart line structures defining at least three channels, each line structure having a width and a height that is less than a height of the first portion of the plurality of electrical contact elements, the at least three channels providing a reservoir that is filled with the underfill material to slow the propagation of the underfill material along the edges of the semiconductor chip, each channel and line structure extending from under the semiconductor chip through the keep-out zone.

14. The semiconductor device of claim 13, wherein the electrical contact elements and the patterned structure comprise the same material.

15. The semiconductor device of claim 13, further comprising:
a dam arranged on the second semiconductor chip and surrounding the keep-out zone.

16. A method for fabricating a semiconductor device, the method comprising:
fabricating a substrate or a first semiconductor chip including an array of electrical contact elements, a first portion of the array of electrical contact elements providing a patterned structure adjacent to and separate from a second portion of the array of electrical contact elements;
electrically coupling a second semiconductor chip to the substrate or the first semiconductor chip via the second portion of the array of electrical contact elements such that no portion of the patterned structure is between any two contact elements within the second portion of the array of electrical contact elements, the patterned structure extending from under the second semiconductor chip away from the second portion of the array of electrical contact elements through a keep-out zone along a second edge of the second semiconductor chip opposite a first edge of the second semiconductor chip and along opposing third and fourth edges of the second semiconductor chip which are orthogonal to the first and second edges; and
dispensing underfill material on the substrate or the first semiconductor chip along the first edge of the second semiconductor chip such that capillary forces propagate underfill material through the array of electrical contact elements, wherein each contact element within the first portion of the array of electrical contact elements is spaced apart from adjacent contact elements within the first portion of the array of electrical contact elements and has a height that is less than a height of the second portion of the array of electrical contact elements, the space between the adjacent contact elements within the first portion of the array of electrical contact elements providing a reservoir that is filled with the underfill material to slow the propagation of the underfill material along the edges of the semiconductor chip.

17. The method of claim 16, wherein the patterned structure slows down the propagation of the underfill material along the third and fourth edges of the second semiconductor chip such that the underfill material propagates through the array of electrical contact elements from the first edge to the second edge faster than along the third and fourth edges.

18. A method for fabricating a semiconductor device, the method comprising:
fabricating a substrate or a first semiconductor chip including an array of contact elements and a patterned structure adjacent to the array of contact elements;
electrically coupling a second semiconductor chip to the substrate or the first semiconductor chip via the array of contact elements such that such that no portion of the patterned structure is between any two contact elements within the array of contact elements, the patterned structure extending from under the second semiconductor chip away from the array of contact elements through a keep-out zone around edges of the second semiconductor chip; and
dispensing underfill material on the substrate or the first semiconductor chip along a first edge of the second semiconductor chip such that capillary forces propagate underfill material through the patterned structure and through the array of contact elements such that the patterned structure inhibits the flow of the underflow material along the edges of the semiconductor chip,
wherein fabricating the substrate or the first semiconductor chip comprises fabricating the substrate or the first semiconductor chip to include a patterned structure comprising at least three channels defined by spaced apart line structures, each line structure having a width and a height that is less than a height of the array of contact elements, the channels providing a reservoir that is filled with the underfill material to slow the propagation of the underfill material along the edges of the first semiconductor chip or the second semiconductor chip, each channel and line structure extending from under the second semiconductor chip orthogonally to a corresponding side of the second semiconductor chip and through the keep-out zone.

* * * * *